United States Patent
Yamamoto

[11] Patent Number: 6,137,370
[45] Date of Patent: Oct. 24, 2000

[54] OSCILLATOR HAVING LOOP INCLUDING TRANSCONDUCTOR BANDPASS FILTER

[75] Inventor: Takeshi Yamamoto, Yokohama, Japan

[73] Assignee: Kabushiki Kaisha Toshiba, Kanagawa-ken, Japan

[21] Appl. No.: 09/234,981

[22] Filed: Jan. 22, 1999

[30] Foreign Application Priority Data

Mar. 4, 1998 [JP] Japan .................................. 10-052045

[51] Int. Cl.$^7$ ...................................................... H03B 5/02
[52] U.S. Cl. ........................ 331/57; 331/108 B; 331/135; 331/177 R
[58] Field of Search ................................. 331/57, 108 B, 331/108 R, 111, 135, 143, 177 R

[56] References Cited

U.S. PATENT DOCUMENTS

| | | | |
|---|---|---|---|
| 4,818,952 | 4/1989 | Kawano et al. | 331/108 R |
| 5,420,547 | 5/1995 | Kikuchi | 331/57 |
| 5,444,421 | 8/1995 | Carroll et al. | 331/111 |
| 5,635,879 | 6/1997 | Sutardja et al. | 331/57 |
| 5,734,299 | 3/1998 | Brown | 331/108 B |
| 5,852,385 | 12/1998 | Izumikawa | 331/57 |

FOREIGN PATENT DOCUMENTS

4-188910   7/1992   Japan .
10-173482  6/1998   Japan .

*Primary Examiner*—Siegfried H. Grimm
*Attorney, Agent, or Firm*—Pillsbury Madison & Sutro LLP

[57] ABSTRACT

An oscillator having a feedback loop circuit formed by two transductors and one amplifier, and two capacitors respectively connected to the outputs of these transconductors. The transconductors and the amplifier are constructed by common-source configuration transistors to which common bias current is supplied. Since they have invert characteristics for the input voltage, the feedback loop is also self-biased by means of negative feedback operation. The oscillation signal is outputted from an arbitrary position on the feedback loop of the oscillator. According to the oscillator as constituted, the oscillation frequency can be controlled in a wide range by varying the bias current to the common-source transistors.

19 Claims, 9 Drawing Sheets

OSCILLATOR HAVING LOOP INCLUDING TRANSCONDUCTOR BANDPASS FILTER

BACKGROUND OF THE INVENTION

1. Field of the Invention

The present invention relates to a MOS type integrated circuit, in particular relates to a basic oscillator when carrying out analogue signal processing.

2. Description of the Related Art

In recent years, due to the increase of digital devices and advancement in digital signal processing technology, CMOS integrated circuits suitable for digital signal processing have gained a large share of the semiconductor market. However, since video and audio signals are analogue signals, analogue signal processing can be more readily carried out, or, even when being digitally processed, analogue circuits are necessary for A/D converter, D/A converter, filtering processing carried out before and after that, oscillators for clock generation and the like. It has been said that, for analogue circuits, bipolar technology is suitable, whereas CMOS technology is unsuitable except for some circuits such as analogue switches and sample-hold circuits. However, in addition to that bipolar and BiCMOS processing are rather expensive, for this reason, it is strongly desired that CMOS integrated circuits are equipped with analogue circuits and digital circuits on one chip, and there has been an increase in the development of circuits for processing analogue signal with CMOS circuit.

The "oscillator" with the CMOS has been used much as clock generators or element circuits of PLL in digital signal processing. As representative oscillators as such, there are "ring oscillators" in which CMOS inverters are arranged in multi-stages to form a ring. Among them, one example of oscillators capable of controlling oscillation frequency is disclosed in Japanese Patent Laid-open Application No. Hei-4-188910, main portion of the oscillator thereof is constituted as such shown in FIGS. 14A and 14B.

Figure 14A:
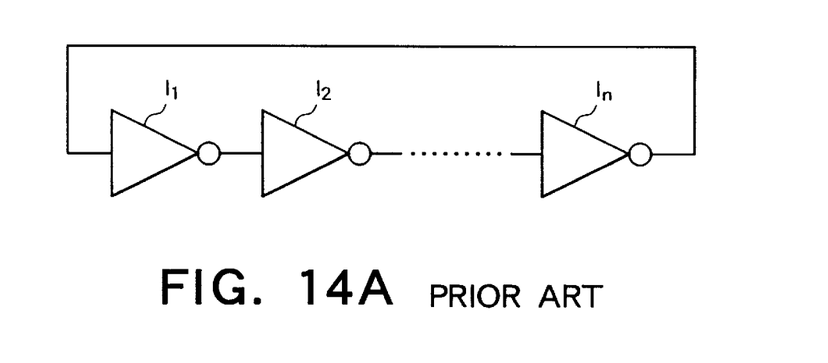
FIG. 14A and FIG. 14B are diagrams depicting a circuit configuration explaining a conventional oscillator.

In this ring oscillator, as shown in FIG. 14A, inverter circuits of I1, I2 . . . In are connected in turn in multi-stages, and output of the final stage of the inverter circuit In is returned to the input of the first inverter circuit I1, thereby a loop of ring is formed.

Figure 14B:
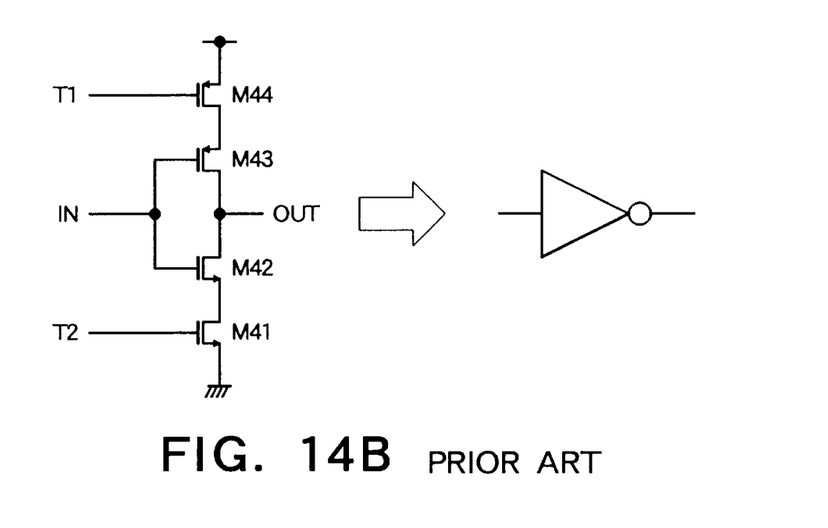

Each of the inverter circuits I1, I2 . . . In, as shown in FIG. 14B, consists of 4 field effect transistors M41 to M44. Transistors M41 and M42 are formed of N-channel MOS transistors, while transistors M43 and M44 are formed of P-channel MOS transistors. Gates of transistors M42 and M43 are connected to be used as an input terminal, while drains of transistors M42 and M43 are connected to be used as an output terminal. Further, drain of transistor M44 and source of transistor M43, source of transistor M42 and drain of transistor M41 are connected respectively, at the same time, source of transistor M44 is connected to a terminal of supply voltage, and source of transistor M41 is connected to earth point.

Each gate of transistors M41 and M44 of each of the inverter circuits I1, I2 . . . In is connected to terminals T1 and T2 for controlling frequencies, respectively. Output signals can be extracted from any one output of each inverter circuit of I1,I2 . . . In, and are outputted through an another inverter which is connected to the loop circuit.

In this ring oscillator, a pair of transistors M41, M42 and a pair of transistors M43, M44 of each inverter circuit are made on/off in a complementary manner depending on signal level supplied to the input terminal IN. Therefore, signal levels at the input terminal In and the output terminal OUT in each inverter circuit are to be inverted. Since inverter circuits are connected in series of multiple stages, such inversions are propagated successively. Due to its ring structure, by returning to its starting point and further enhancing inversion, finally the inversion motion results in oscillation of a whole loop.

Such an oscillation frequency is determined by the delay time of inversion signals between input and output of each inverter circuit. When a delay time for an inverter is td, an oscillation frequency fosc is $$fosc = 1/(Ntd) \qquad (1)$$

Respective gate voltages of transistors M41 and M44 restrict current supplied to these field effect transistors. Thereby, current supplied from transistor M44 to M41 during inversion of inverter circuit is also restricted, thus delay time td also varies. Therefore, if voltages supplied to control terminals T1, T2 are varied, delay times of inversion signals in respective inverter circuits will change all at once.

Thus, when the delay time of inversion signals varies, since the time at which propagation of inversion returns after one round of the loop also varies, the oscillation frequency also varies according to equation (1). That is, when the delay time td per a stage is made fast, the frequency becomes high, and when the delay time td is made slow, the oscillation frequency becomes low, thus the oscillation frequency can be easily controlled by varying the delay time of inversion signals.

A ring oscillator comprising of such an inverter circuit, when employed in a CMOS LSI which is equipped with analogue circuits and digital circuits on one chip, has the following disadvantages such as 1. The ring oscillator itself generates a noise like pulse to be liable to adversely affect on the other analogue circuits.

2. Since it is likely to be influenced by the noise of the power source and the like, there is much jitter (phase noise). In the inverter circuit, only at the instance of inversion, a relatively large current flows between the power source and ground.

Therefore, each time when the inverter reverses, according to resistances of power source line and ground line, pulse voltages are generated at power source and ground. When LSI contains analogue circuits, even if a measure is taken such as separation of a power source line and the like, this pulse voltage goes around to analogue circuit side due to common impedance of the power source line or capacitive coupling according to substrate and the like. This gives some influence to analogue circuits, thereby pulse noise is added to analogue signal to inevitably deteriorate its quality to some degree.

In particular, when oscillator output is employed as a certain reference signal in analogue signal processing, since ratio of frequency of this reference signal and that of the aforementioned pulse voltage has integer ratio, beat component is added on the signal and may be noise incapable of being separated by filter and the like. Further, wave form of inverter circuit constituting a ring oscillator becomes rectangular wave which swings fully between the power source and ground. Since this has spurious components (harmonic component) with high energy, if there is a part of high impedance in an analogue circuit, by plunging in as radiation, the signal quality tends to deteriorate.

On the contrary, even in digital circuits, at the instance when state transits, relatively large penetrating current flows between the power source and ground. Therefore, when an LSI contains digital circuits, for whole digital circuits, various inversions occur with timings of the edge of clock rise or fall signals, and a noise like pulse due to this is added on power source line or ground line. As described above, even if a measure such as a separation of power source line and the like is taken, this pulse voltage, due to common impedance of the power source line and due to capacitive coupling according to substrate, can not be avoided to go around to the power source/ground line of oscillator.

In the ring oscillator, because of oscillation with amplitude of voltage between a power source and ground, the noise added on the source voltage induces temporary variation of amplitude, and causes fluctuation to the delay times of the inverter which determines frequency. This finally becomes the jitter (phase noise) of oscillation frequency and deteriorates spectral purity of oscillation. Further, penetrating current like the pulse which is generated by the inverter circuit itself constituting the ring oscillator during inversion causes to generate pulse voltage on the power source/ground line which the inverter circuit itself is using, thereby that results in enhancement of the jitter (phase noise) of oscillation frequency.

SUMMARY OF THE INVENTION

An object of the present invention is to provide an oscillator suitable for a CMOS-LSI containing highly accurate analogue circuits, wherein the oscillator itself is not likely to generate noise, and is not likely to be influenced by power source noise and the like.

In order to achieve the aforementioned object, an oscillator of the present invention has a feedback loop formed by connecting in series a first and a second transconductors each of which has a high negative gain for input voltage, and has a certain transconductance; an amplifier having smaller negative gain than those of the first and the second transconductors; wherein a first capacitor is attached to an output terminal of the first transconductor, a second capacitor to that of the second transconductor, respectively, to form a band-pass filter, and the output signal of the band-pass filter is feed-backed to input signal of the band-pass filter, and output is drawn out of arbitrary positions on the feedback loop.

Further, as another means for achieving the aforementioned object, an oscillator of the present invention has a feedback loop formed by connecting in series of constituent elements including a first and second transconductors each of which has a pair of input terminals and a pair of output terminals, and has a high negative gain for common-mode input voltage, and has a certain transconductance for the differential-mode input voltage; a first amplifier which has a pair of input terminals and a pair of output terminals, and has a certain gain for the differential-mode input voltage, and has a negative gain of the same degree with the gain for common-mode input voltage; wherein a first capacitor is attached to output terminals of the first transconductor, a second capacitor to that of the second transconductor, respectively, to form a band-pass filter, and the output signal of the band-pass filter is feed-backed to input signal of band-pass filter, and output signal is capable of drawing out from arbitrary positions on the feedback loop.

An oscillator of the present invention has a means of controlling oscillation frequency by varying values of the bias currents while maintaining at a constant value the ratio of bias current which is supplied to field effect transistors constituting the transconductor, and bias current which is supplied to field effect transistors of the amplifier, and that results in controlling the frequency in wider range.

Thus, since most of the elements operate in linear region and do not operate in complete switching region, a noise like pulse does not occur. In addition, since oscillation amplitude is determined independently of source voltage and the value of amplitude can be suppressed small, less spurious occurs, not resulting in jitter (phase noise) as a result of fluctuation of oscillation amplitude due to source noise. From such reasons, oscillators in accordance with the present invention are the most suitable ones for CMOS-LSI including highly accurate analogue circuits.

DESCRIPTION OF THE PREFERRED EMBODIMENT

In the following, details of embodiments for carrying out the present invention will be described with reference to the drawings.

Figure 1:
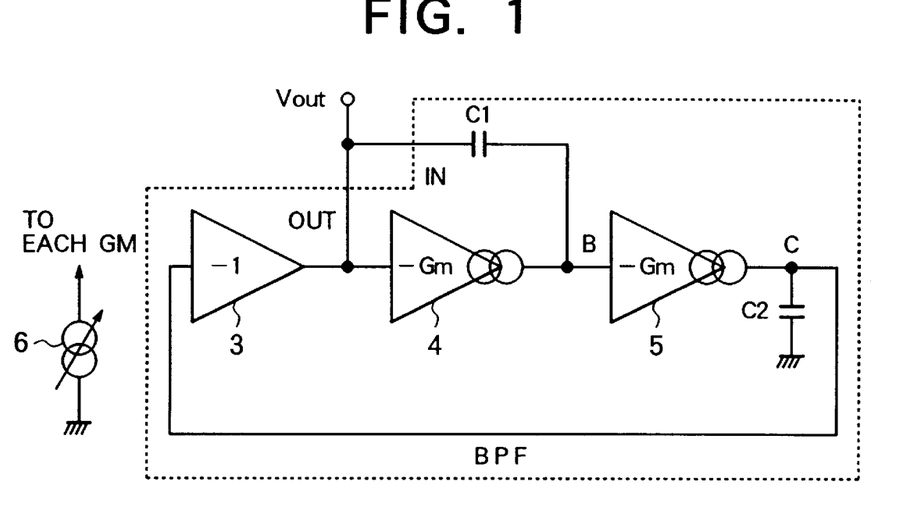
FIG. 1 is a diagram depicting a circuit configuration explaining a first embodiment of the present invention.

A first embodiment of the present invention will be described with a diagram depicting circuit configuration shown in FIG. 1. In the figure, a portion enclosed by a dotted line shows a second-order band-pass filter (BPF). Output of an amplifier 3 is connected to an output terminal Vout which is output of the BPF. Further, output voltage of the amplifier 3 has a high negative gain for input voltage, and is supplied to input of a transconductor 4 which has a certain transconductance Gm. Output current of the transconductor 4 is supplied to an output terminal Vout through a capacitor C1, and is supplied to input of a transconductor 5 which has high negative gain for the input voltage and has a certain transconductance Gm. Output of the transconductor 5 is grounded through a capacitor C2, and is supplied to input of the amplifier 3 having smaller negative gain than those of transconductors 4, 5 for the input voltage. The left terminal of capacitor C1 shown in FIG. 1 is an input terminal IN of the BPF, while output point A of the amplifier 3 is an output terminal OUT of the BPF. The input terminal IN of this BPF and the output terminal OUT are directly connected and constitute an oscillator.

A general transfer function of thus constituted the second order BPF can be expressed by a following equation.

$$H(s)=\omega o \cdot s/\{s^2+\omega o \cdot s/Q+\omega o^2\} \quad (2)$$

Here, s denotes a complex frequency, ω denotes an angular frequency, ωo denotes a central frequency of the BPF, and Q denotes selectivity of BPF characteristic. Under a steady state, being s=jω(ω=2 πf), by substituting this inequation (2), the following equation can be obtained.

$$H(j\omega)=j\omega o \cdot \omega/\{(\omega o^2-\omega^2)+j\omega o \cdot \omega/Q\} \quad (3)$$

Figure 11:
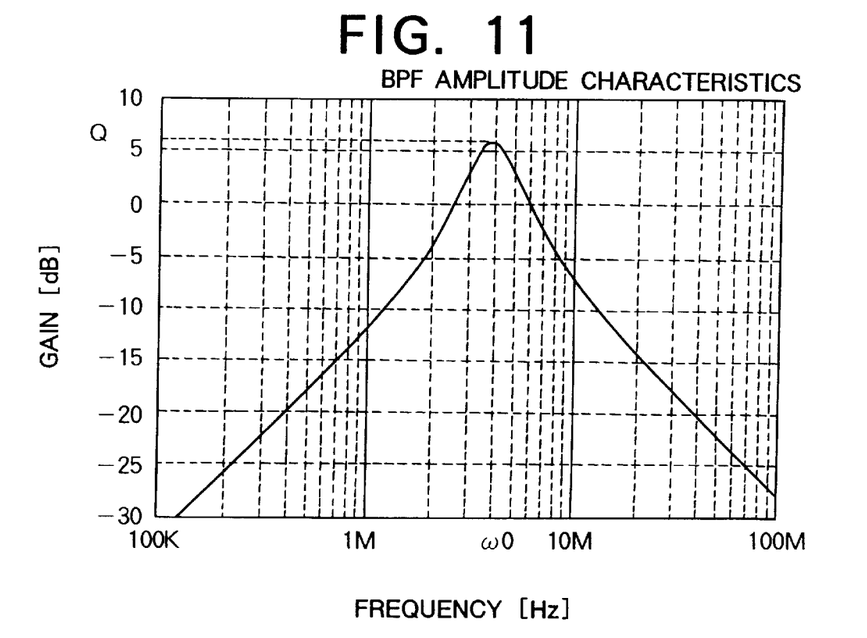
FIG. 11 is a gain characteristic diagram of BPF of FIG. 1.
Figure 12:
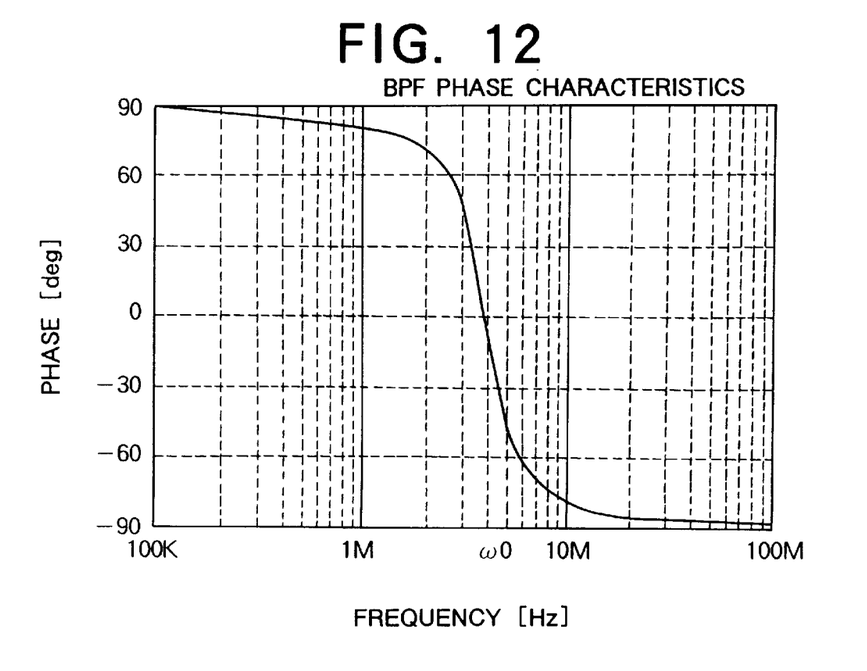
FIG. 12 is a phase characteristic diagram of BPF of FIG. 1.

If frequency characteristics of BPF are drawn on the basis of this, gain-frequency characteristics, phase-frequency characteristics becomes as shown in FIG. 11, FIG. 12, respectively. That is, at the central frequency ωo, the gain becomes the maximum, and the phase becomes 0°.

When a BPF is short-circuited between input and output, the frequency characteristics shown in FIG. 11 and FIG. 12 become loop characteristics of oscillator as they are. At the central frequency, the phase being 0°, the BPF becomes positive feedback, since the loop gain becomes 1 or more if Q is 1 or more, it satisfies oscillation criterion and oscillates.

In the circuit of FIG. 1, ωo becomes $$\omega o=Gm/\sqrt{(C1C2)}, Q=\infty$$

when the frequency is in the neighborhood of u/2π, The BPF oscillates strongly. The oscillation occurs in a loop of A point B point C point A point, since, at respective points, oscillation wave forms with different only phases but the same frequency appear, basically at any points output can be drawn out. However, because of relatively low impedance, the A point which is output of the amplifier 3 is desirable as an output terminal.

Constituent elements of each stage of this circuit are either transconductor or amplifier, and their relations between input voltages and output voltages are all inverted one. Constituent element 4 and constituent element 5 shown in FIG. 1 are transconductors with input voltage and output current, and, since output terminals are of high impedance, voltage gain between input and output are very high. That is, it is a negative amplifier having high gain with respect to direct current. The constituent element 3 is an amplifier having input voltage and output voltage, and voltage gain around 1 (in the range of 0.1 to 10) is employed. That is, it is an inversion amplifier having a low gain with respect to direct current.

When a circuit illustrated in FIG. 1 is constituted of such constituent elements, as to direct current, each constituent element of 3 to 5 is in an inverted relation between input and output, and, since the number of constituent elements which constitute loop is 3, after one round of the loop, it becomes negative feedback (phase shift of 180°) as to direct current. Thus, the respective nodes constituting the loop have stable operating points at intermediate voltages between power source and ground. Next, when the loop is considered as alternating current characteristics, thereto capacitors C1 and C2 are added, there occurs a situation where, as a total loop, the oscillation criterion is satisfied at around angular frequency ωo, resulting in oscillation with this frequency.

Figure 2:
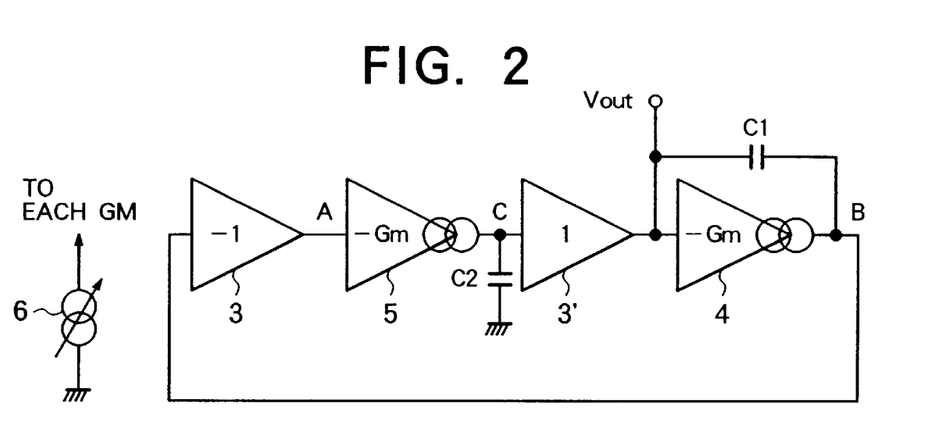
FIG. 2 is a diagram depicting a circuit configuration explaining a modification example of the first embodiment of the present invention.

FIG. 2 is a modification example of the first embodiment. Since it is a slight modification in which only the order of constituent elements is changed, to the constituent elements identical with FIG. 1, the same reference numerals are given to establish correspondence therebetween. This example shows a circuit in which a combination of a transconductor 4 and a capacitor C1 and a combination of a transconductor 5 and a capacitor C2 shown in FIG. 1 are only interchanged. However, since impedance at C point is high, when output of transconductor 5 is connected to input of the transconductor 4 and capacitor C1 as they are, the capacitor C1 becomes a load of the transconductor 5, and condition changes drastically from that of FIG. 1. Therefore, by addition of a buffer circuit 3' having gain 1 to convert impedance, matching for this portion is attained.

By implementing like this, since the total loop Characteristics does not vary even when order of the constituent elements is interchanged, as a whole it operates in an identical manner with FIG. 1, and oscillates at the central frequency ωo of the BPF. If the buffer circuit 3' is replaced with an inversion amplifier having gain −1 identical with an amplifier 3, though the amplifier 3 can be removed, resultantly it becomes a circuit identical with FIG. 1.

Figure 3:
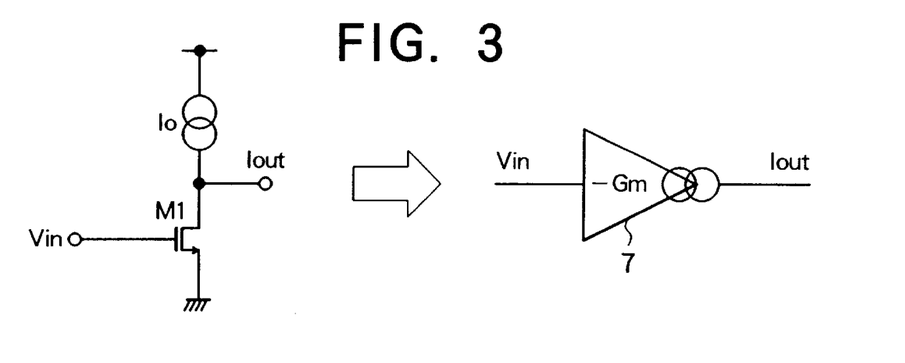
FIG. 3 is a circuit diagram explaining concretely a transconductor of FIG. 1.
Figure 4:
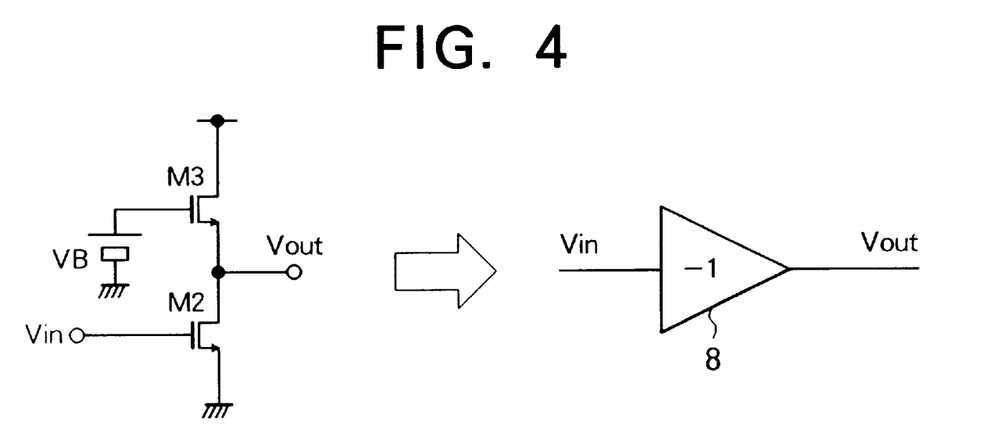
FIG. 4 is a circuit diagram explaining a specific example of an amplifier of FIG. 1.

Actual circuits of transconductor and amplifier which are employed in the first embodiment and its modification example shown in FIG. 1 and FIG. 2 are shown in FIG. 3 and FIG. 4, respectively. The transconductor 7 as shown in FIG. 3 is constituted of a MOS transistor M1, source thereof is connected to ground, gate thereof is used as the input terminal Vin, and constant current Io is supplied from a supply voltage to drain, which is used as an output terminal Iout. This circuit satisfies a condition that this circuit is one that has high negative gain as input-output characteristics of direct current.

An amplifier 8 is constituted of MOS transistors M2, M3 as illustrated in FIG. 4. Source of transistor M2 is connected to ground, gate thereof is used as the input terminal Vin, drain thereof is connected to source of transistor M3, and this drain is the output terminal Vout. Gate of transistor M3 is connected to bias voltage VB, drain thereof is connected to a supply voltage. The gain of this circuit is determined by square root of ratio of gate size W/L of the transistor M2 to gate size W/L of the transistor M3. The ratio of the gate sizes between elements can not be set so large that the gain can be varied only in the range of one digit around 1 (0.3 to 3=−10 dB to 10 dB).

Therefore, the gain of the amplifier 8 is far smaller than that of transconductor 7. As to input/output characteristic of direct current, it satisfies a circuit condition of the amplifier having far smaller negative gain than that of transconductor 7. Incidentally, in the examples of FIG. 1 and FIG. 2, the sizes of transistors M2, M3 are made identical to make the gain of direct current "−1".

Figure 5:
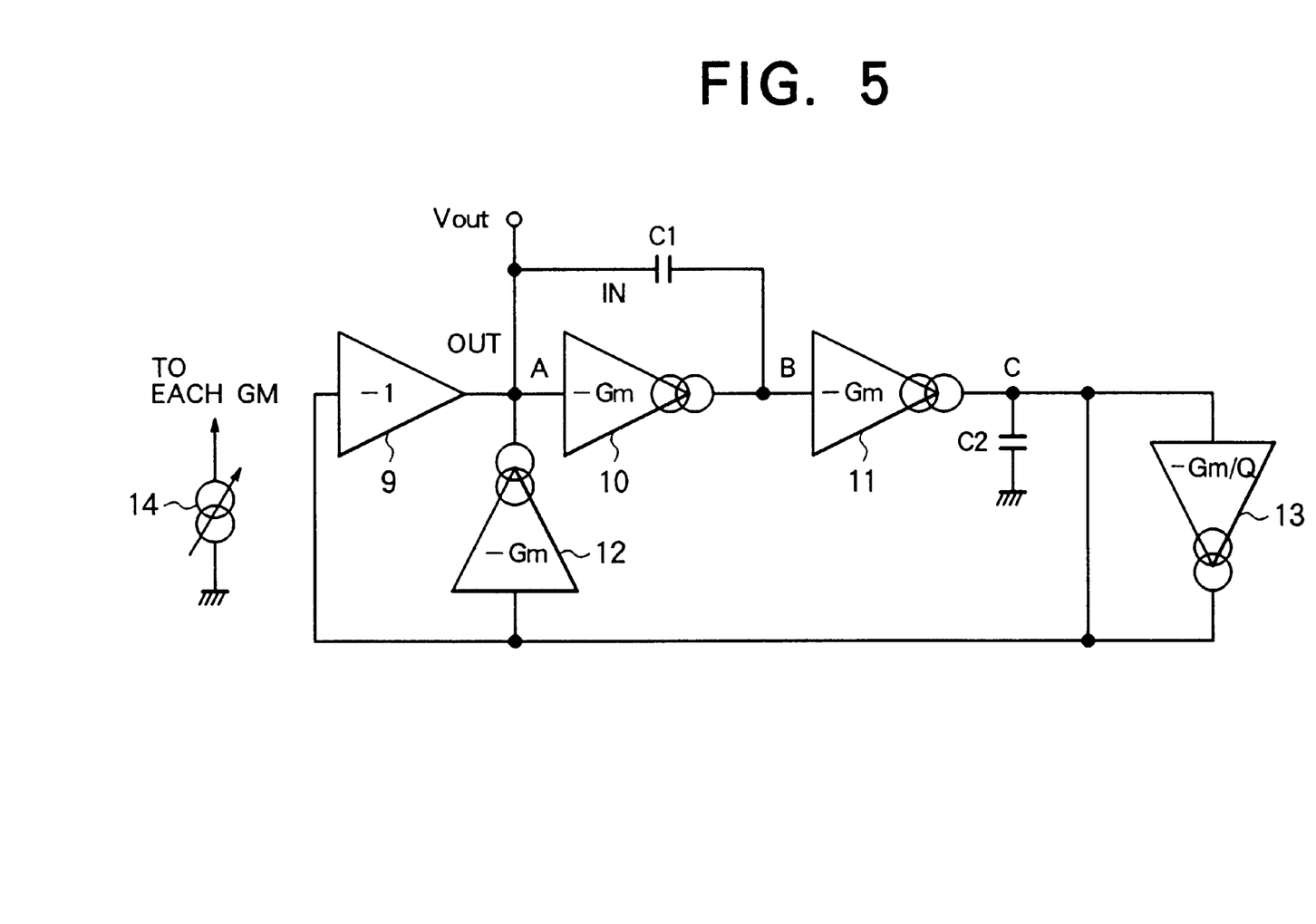
FIG. 5 is a diagram depicting a circuit configuration explaining another modification example of the first embodiment of the present invention.

FIG. 5 is another modification example of the first embodiment. This modification example is derived from FIG. 1 by modifying the circuit in it, that is two transconductors shown by 12 and 13 are added to FIG. 1. The transconductor 12 compensates shift of the oscillation criterion caused by capacitor C1 which newly becomes load of amplifier 9 when an oscillation loop is constituted by connecting input and output of the BPF.

When such an amplifier 8 that is illustrated in FIG. 4 is constituted with CMOS transistors, output impedance can not be made so low. Therefore, when the capacitor C1 becomes a new load, the oscillation criterion shows a relatively large shift. There, by supplying the whole alternating current supplied to capacitor C1 from the transconductor 12, impedance at A point being considerable to the output side of the amplifier 9 is caused to be zero. An alternating current supplied to the capacitor C1 is wholly supplied from transconductor 10. Negative voltage of A point which is input thereof, being C point, by using this as input and converting into current with a conversion factor "–Gm" identical as that of transconductor 10, is supplied to A point which is an opposite electrode of the capacitor C1. Thereby, though current supplied to the capacitor C1 does not vary, at A point, the alternating current supplied through the capacitor C1 is cancelled out by the current which transconductor 12 supplies.

Thus, there is no alternating current which the amplifier 9 has to supply, and, even when the input and output of the BPF are mutually connected, oscillation criterion does not shift, resulting in obtaining desired oscillation frequency.

Transconductor 13 is designated for setting Q of the BPF. If there is no transconductor 13, the Q becomes infinity to induce rather strong oscillation. When the Q is too large, the amplitude of oscillation also becomes large, wave form thereof becomes almost rectangular, and it approaches oscillation of a ring oscillator. Therefore, as described above, there is such a problem that leakage to analogue signal due to the pulse current or spurious occurs.

There, this problem is alleviated through reduction of the Q of the BPF with transconductor 13. If the value of transconductance is set "–Gm/Q", selectivity of the BPF can be suppressed to Q.

Figure 6:
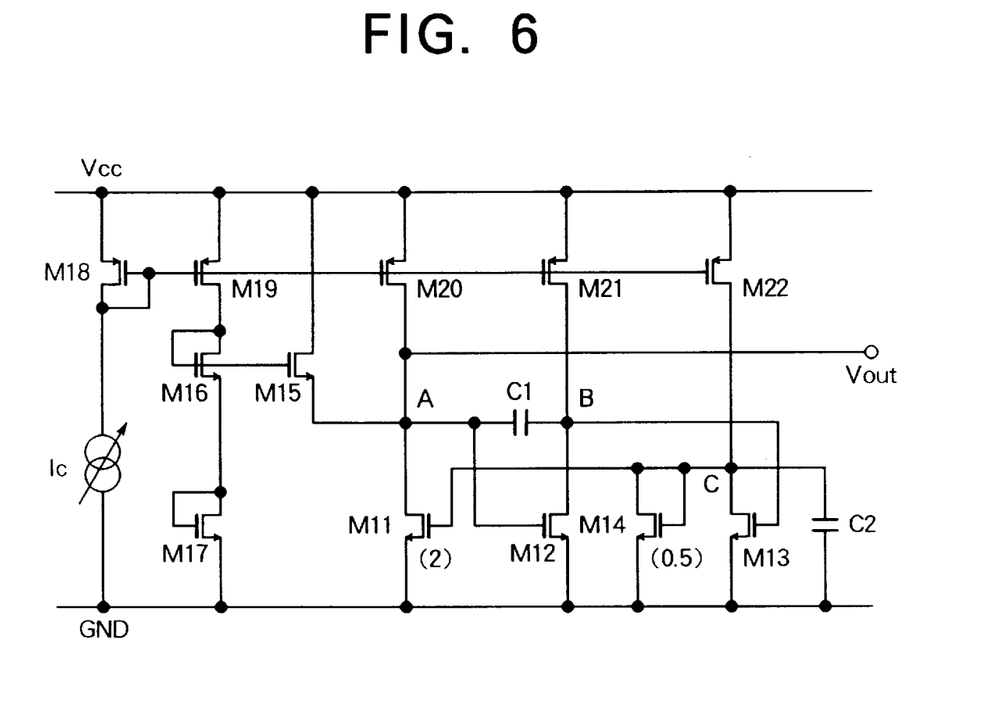
FIG. 6 is a circuit diagram explaining a specific example of FIG. 5.

The transconductor 7 shown in FIG. 3 and the Amplifier 8 shown in FIG. 4 are applied in FIG. 5 to rewrite into circuit with MOS transistors, which is shown in FIG. 6 for explanation. In this circuit, all the NMOS transistors are of the same shape and the same size except for transistors M11 and M14, and all the PMOS transistors are of the same shape and the same size except for transistor M22. W/L of transistor M11 is twice as large as the principal size of NMOS, and W/L of transistor M14 is one half as large as the principal size of NMOS. W/L of transistor M22 is 3 halves as large as the principal size of PMOS.

In FIG. 5, the amplifier 9 is constituted of transistors M11 and M15, the transconductor 10 is constituted of transistors M12 and M21, the transconductor 11 is constituted of transistors M13 and M22, the transconductor 12 is constituted of transistors M11 (used in common with the amplifier 9) and M20, the transconductor 13 is constituted of transistor M14. As bias voltage of an amplifier 8, to a circuit which connects the transistors M16 and M17 in series as shown in FIG. 6, reference current Ic is supplied by branching at transistor M19, thus obtained voltage is supplied to the gate of the transistor M15.

By implementing like this, the bias currents proportional to the gate sizes can be supplied to all NMOS transistors, and current densities at gate regions of all MOS transistors can be made equal. At this time, all the operating voltages at the respective nodes of A, B and C constituting the oscillation loop shown in FIG. 5 become equal. Further, if drain currents of transistors M11 to M14 are expressed by $$Id = k(Vgs - Vth)^2 \quad (4)$$

Transconductance Gm of the respective transistors of M11 to M14 can be expressed by $$Gm = \delta Id/\delta Vgs = 2\sqrt{(kIc)} \quad (5)$$

As mentioned above, the oscillation frequency fosc becomes $$fosc = \omega o/2\pi = Gm/\{2\pi\sqrt{(C1C2)}\} = \sqrt{(kIc)}/\{\pi\sqrt{(C1C2)}\} \quad (6)$$

This means that the oscillation frequency can be varied in proportion to the square root of bias current Ic shown in FIG. 6.

Thus, by varying the bias current Ic, the oscillation frequency can be readily controlled.

In an actual circuit, since a loop gain of an oscillation loop becomes more than 1, the amplitude gradually increases to result in swinging to an operation limit of a transistor. Though not so large as the conventional ring oscillator, it becomes a rather large amplitude and the wave form distortion also becomes large. Thus, normally, in an example of an oscillator shown in FIG. 1, a limiter circuit is inserted between A point which is an output of a band-pass filter and the input IN to limit the amplitude. Even in the oscillator shown in FIG. 5, a limiter circuit is inserted between A point which is an output of a band-pass filter and the input IN, in this case, however, the output of the transconductor 12 is not the A point, accordingly it is connected to the input IN of the band-pass filter. By thus implementing, the oscillator does not swing to the full source voltage like a ring oscillator which employs the conventional inverter circuit but it can be limited to the amplitude which the limiter circuit restricts. In addition, since it operates not in a complete switching manner but in an approximately continuous area, it does not occur that pulse noise is added to source line. The wave forms at A to C points are small in their amplitudes and close to triangular wave or sinusoidal wave, accordingly harmonic component is slightly contained.

Therefore, even if there is an analogue circuit sensitive to harmonic noise in the neighborhood, noise due to leakage through common impedance of source line or due to plunging via space is small. Further, since the oscillation frequency can be made completely independent of the source voltage, even when digital circuit exists together, the pulse noise which is generated in the digital circuit and added on the source line is not likely to interfere to increase jitter (phase noise). Thus, when used in a CMOS-LSI which consolidates analogue/digital circuits including highly accurate analogue signal processing, it is very effective.

The second embodiment of the present invention will be described with reference to a diagram depicting circuit configuration of FIG. 7. In this embodiment, the respective constituent elements of the embodiment illustrated in FIG. 5 of the first embodiment are converted to fully differential type circuits and the BPF shown in FIG. 5 is the differential type oscillator as a whole.

The transconductors 23,25,28,29 are operated with differential-mode input voltage and differential-mode output current, and, since the output terminal is of high impedance, common-mode voltage gain between input and output is very high. For direct current common-mode voltage, it becomes an inversion amplifier having high gain. Though an amplifier 22 is operated with differential-mode input voltage and differential-mode output voltage, the voltage gain of around 1 (at most from 0.1 up to 10) is used for differential-mode gain and common-mode gain. For direct current common-mode voltage, it becomes an inversion amplifier having low gain.

Figure 7:
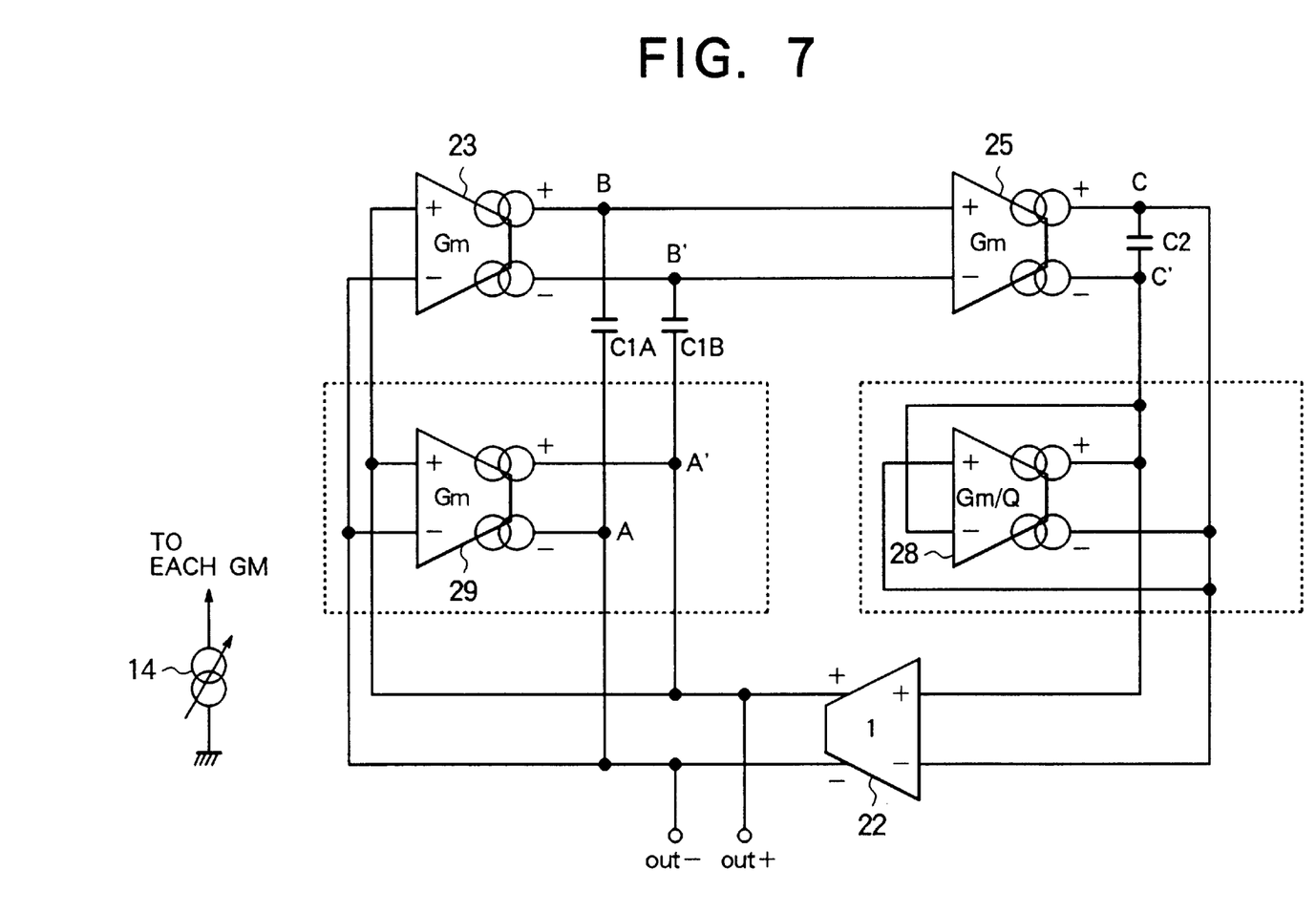
FIG. 7 is a diagram depicting a circuit configuration explaining a second embodiment of the present invention.

When a circuit of FIG. 7 is constituted with such constituent elements, as common-mode direct current characteristics, respective constituent elements are in inverted relation between input and output, and since the number of constituent elements which constitute loop are 3 of 22, 23, 25, after one round of loop, it becomes negative feedback (phase circulation of 180°) as to direct current. Respective nodes constituting common-mode loop have stable operating points at an intermediate voltage between power source and ground. As to differential-mode operation, primarily respective constituent elements are connected between terminals of the identical polarity, and at only one point the polarity thereof is interchanged to form a loop. In FIG. 7, at the point where output of the transconductor 25 is inputted in the amplifier 22, the polarity thereof is changed.

By connecting like this, as to differential direct current characteristics, all the "+polarity terminals" and "−polarity terminals" of respective differential-mode input voltage and respective differential-mode output currents are operated to be same voltage. Incidentally, though all the oscillators of FIG. 7 are constituted of ones being in inverted relation between input and output, whatever number of circuits which are not in an inverted relation between input and output are inserted to the feedback loop, it is obvious that the function as an oscillator is not changed. Therefore, as elementary circuits constituting the loop, only the circuits which are in an inverted relation between input and output are referred to, whatever number of elementary circuits which are not in an inverted relation can be included.

In FIG. 7, a main portion of the BPF is a feedback loop constituted of transconductor 23, transconductor 25 and amplifier 22. The transconductor 23 corresponds to the transconductor 10 shown in FIG. 5, and the transconductor 25 corresponds to the transconductor 11 shown in FIG. 5. The amplifier 22 corresponds to the amplifier 9 shown in FIG. 5, however, it is only for common-mode voltage, and as to differential-mode voltage, the transconductor 25 and the amplifier 22 are connected by changing polarity, thereby "−1" is realized.

The role of transconductors 28 and 29 shown by dotted lines shown in FIG. 7 is utterly the same with those of the transconductor 13 and 12 shown in FIG. 5, respectively. That is, the transconductor 29 compensates fluctuation of oscillation criterion due to capacitive load upon connection of input and output of the BPF, and the transconductor 28 reduces the Q of the BPF.

Figure 8:
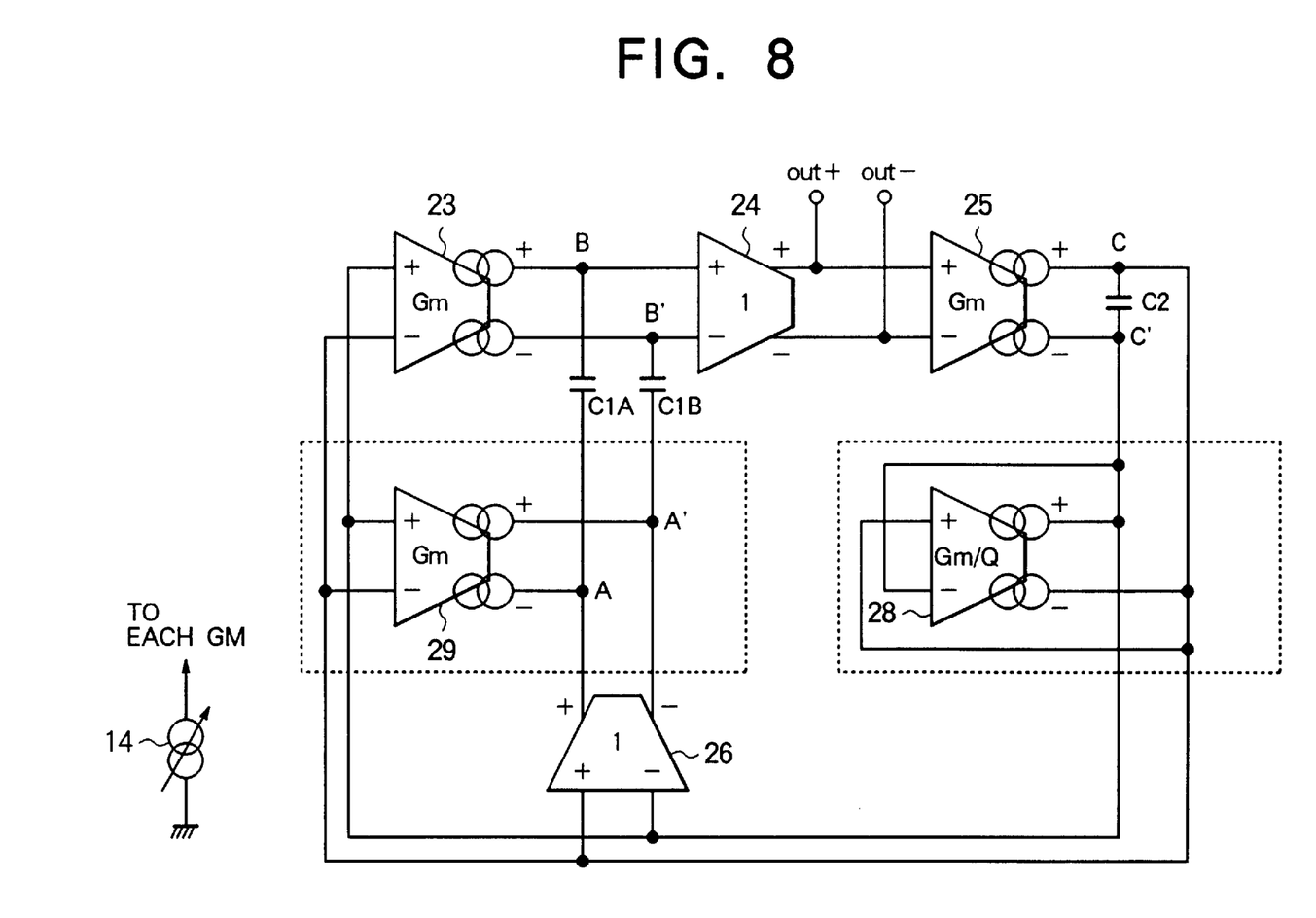
FIG. 8 is a diagram depicting a circuit configuration explaining another modification example of the second embodiment of the present invention.

FIG. 8 is a modification example of the embodiment shown in FIG. 7. When the amplifier 22 shown in FIG. 7 is transferred to a position of the amplifier 26 shown in FIG. 8, in order that the feedback loop of the BPF is to be common-mode negative feedback, the amplifier 24 has to be added to make 3 pieces the number of constituent elements of common-mode inversion on the feedback loop.

Figure 9:
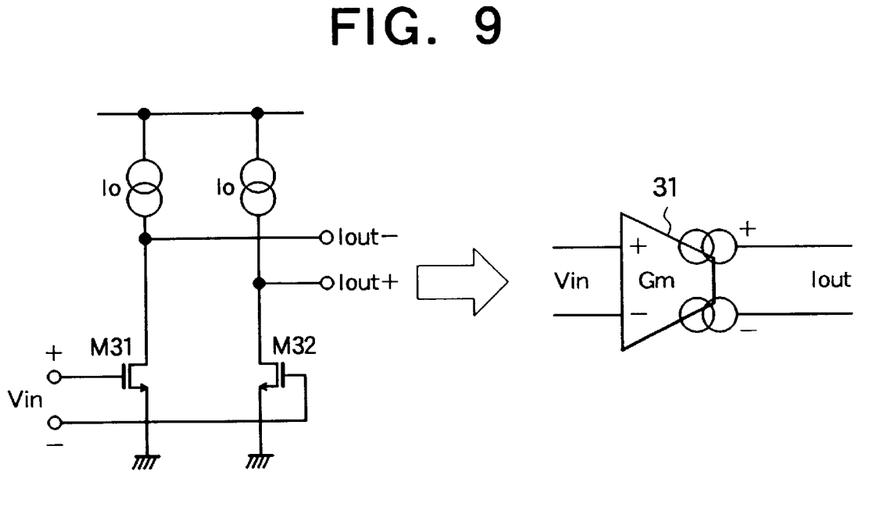
FIG. 9 is a circuit diagram explaining concretely a transconductor used in the second embodiment of the present invention.
Figure 10:
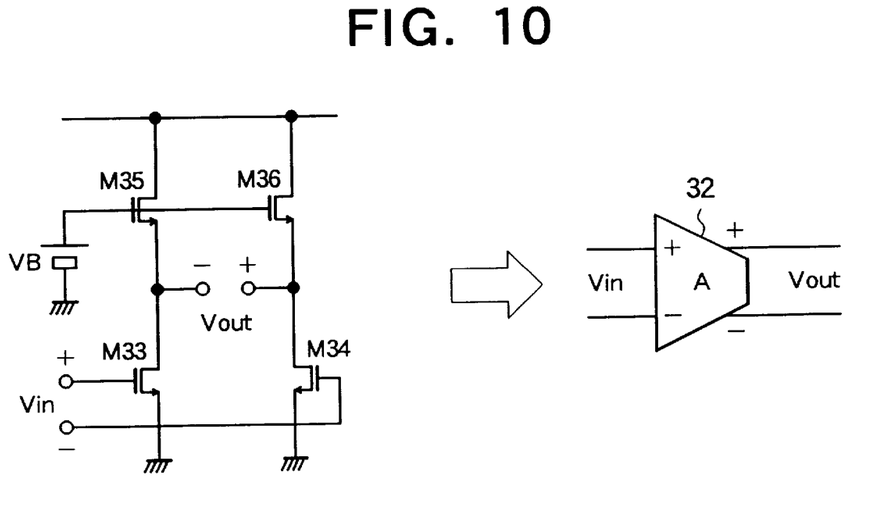
FIG. 10 is a circuit diagram explaining concretely an amplifier employed in the second embodiment of the present invention.

Actual circuits of transconductor and amplifier being employed in the second embodiment shown in FIG. 7 and FIG. 8 are shown in FIG. 9 and FIG. 10, respectively. The transconductors 23,25,28,29 are respectively constituted of MOS transistors M31 and M32 as shown in FIG. 9, a pair of sources thereof being connected to ground, a pair of gates thereof being used as input terminals, a constant current Io shown in FIG. 9 being supplied to a pair of drains thereof from respective supply voltages, the pair of drains being used as output terminals. Such a circuit satisfies a condition that it is a circuit having high negative gain for common-mode voltage of direct current.

The amplifiers 22,24,26 are respectively constituted of MOS transistors M33 to M36 as shown in FIG. 10, sources of the transistors M33 and M34 being connected to ground, the pair of gates being used as input terminals, drains being connected to sources of transistors M35 and M36, respectively, to be used as output terminals, gates of transistors M35 and M36 being connected to bias voltage VB, drains being connected to source, respectively. The differential-mode gain and common-mode gain of this circuit are determined by square root of ratio of gate size W/L of transistors M33, M34 to gate size W/L of transistors M35, M36. The ratio of gate sizes between MOS transistors can not be set so large that the gains can be varied at most in the range of one digit around 1(0.3 to 3=−10 dB to 10 dB).

In the embodiments of FIG. 7 and FIG. 8, all the sizes of transistors M33 through M36 are set identical to obtain common-mode gain of "−1", and differential-mode gain of "1" for direct current. Therefore, the common-mode gain of the amplifier becomes a value far smaller than that of the transconductor, and it satisfies a condition that, for common-mode voltage of direct current, the circuit has a negative gain much smaller than that of the transconductor.

In the cases of the fully differential type oscillators shown in FIG. 7 and FIG. 8, another operation in common-mode has to be considered. This circuit is an oscillator, however it should oscillate only in differential-mode, but should not oscillate in common-mode. Upon considering common-mode, with ground as reference, average voltage of AA', average voltage of BB' and average voltage of CC' need only to be considered. Capacitance values with respect to ground attaching to output terminals of respective constituent elements, when parasitic capacitances of capacitor are neglected, become C1A//C1B at BB' points, 0 at AA' points, and also 0 at CC' points. That is, in the loops forming a ring of circuits shown in FIG. 7 and FIG. 8, a dominating pole appears at BB' point in low frequency, while poles corresponding to AA' point and CC' point appear only in far distant high frequency region. Therefore, at frequency where phase start circulating under influence of poles of AA' point and CC' point, the amplitude attenuates sufficiently due to the dominating pole of BB' point, and the loop gain becomes 1 or less to be able to avoid oscillation.

Thus, for common-mode operation, C1A and C1B function as phase compensating capacitors, since phase compensation is carried out as a common-mode loop, accordingly the oscillation in common-mode does not occur. This is due to insertion of capacitor C2 between output terminals not to attach capacity to ground.

Incidentally, even in the case of the second embodiment shown in FIG. 7 and FIG. 8, as identical as the case of the first embodiment, the oscillation frequency as an oscillator varies in proportion to the square root of the bias current Ic shown in FIG. 6. By varying the bias current Ic like this, the oscillation frequency can be controlled readily. In addition, in an actual circuit, a limiter circuit is inserted between the output and the input of the band-pass filter to limit the oscillation amplitude. That is, these limiter circuits are inserted between A point and an output terminal out−, and between A' point and an output terminal out+, respectively, shown in FIG. 7, and at the positions of the A point and a + output terminal of the amplifier 26, and the A' point and − output terminal of the amplifier 26 shown in FIG. 8, respectively.

Thus, a circuit configuration according to the second embodiment is less generative of harmonic noise by itself, and is likely to be less influenced by noise added on a power source and the like. Furthermore, since being a fully differential type circuit, if outputted differentially, the even order harmonic noise can be suppressed, and jitter due to source noise can be further alleviated. Thus, high quality oscillation signals can be obtained.

Figure 13:
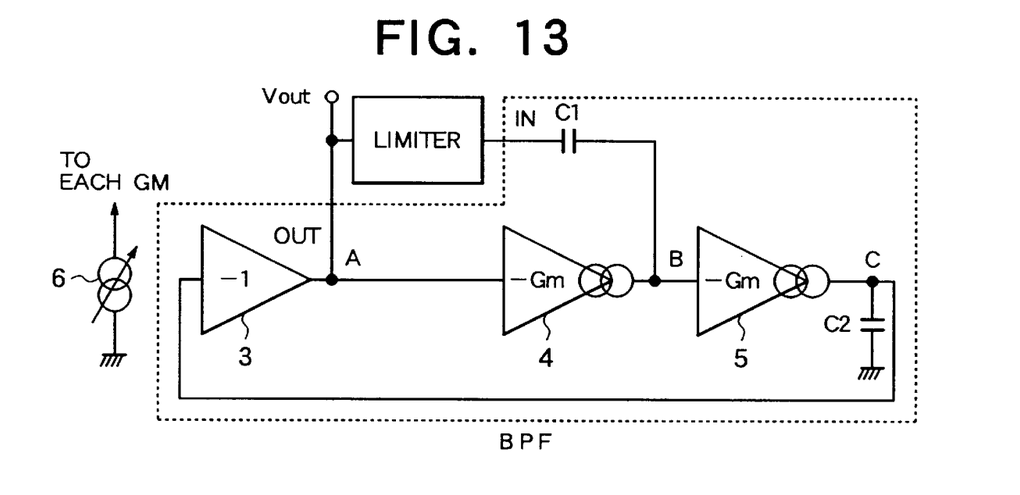
FIG. 13 is a diagram depicting a circuit configuration explaining a modification example of FIG. 1.

The present invention is not restricted to the aforementioned embodiments. For instance, only in a limited amplitude range, the characteristics of the BPF illustrated in FIG. 11 can be obtained. Therefore, in order to oscillate at the central frequency of the BPF with stability, the oscillation amplitude is required to be restricted at least to one point on the loop. For this reason, as shown in FIG. 13, a limiter circuit 131 is disposed between output and input of the BPF to restrict oscillation amplitude. Thereby, stable oscillation at the central frequency of the BPF can be obtained.

This works as well even in the differential configuration such as described in FIG. 7 by restricting oscillation amplitude at least to one point of respective loops.

As described above, according to an oscillator being constituted by a CMOS involving the present invention, an oscillator being less generative of noise by itself, and being less influenced by source noise and the like, and of less jitter when a CMOS-LSI that is equipped with analogue circuits and digital circuits on one chip is used, can be materialized. Moreover, it can be operated at low voltage, and frequency control over a wide range can be readily carried out only by varying bias current.

What is claimed is:

1. An oscillator, comprising:

a feedback loop formed by connecting in series first and second transconductors, each of which has a high negative gain and a certain transconductance; and an amplifier of a much smaller negative gain than those of the first and second transconductors, wherein a first capacitor is attached to an output of the first transconductor, and a second capacitor is attached to an output of the second transconductor to form a band-pass filter, and wherein an output of the band-pass filter is fed-back to an input of the band-pass filter, and the output of the band-pass filter is drawn out from arbitrary positions on the feedback loop.

2. The oscillator as set forth in claim 1, wherein the feedback loop is constituted by connecting the output of the first transconductor to an input of the second transconductor, the output of the second transconductor to an input of the amplifier, and an output of the amplifier to an input of the first transconductor, and wherein one end of the first capacitor is used as the input of the band-pass filter, the other end of the first capacitor connected to the output of the first transconductor, one end of the second capacitor connected to ground or a constant voltage point, the other end of the second capacitor connected to the output of the second transconductor, and the output of the amplifier is used as the output of the band-pass filter.

3. The oscillator as set forth in claim 2, wherein a third transconductor, both of which input and output are short circuited, is connected to the output terminal of the second transconductor.

4. The oscillator as set forth in claim 3, wherein a fourth transconductor, both of which input and output are common with those of the amplifier, is connected to the first transconductor, and wherein ratio of a transconductance of the fourth transconductor to a transconductance of the first transconductor is equal to an absolute value of a gain of the amplifier.

5. The oscillator as set forth in claim 1, wherein the transconductors are constituted of one piece of a field effect transistor having a source connected to a common constant voltage terminal, a gate being used as an input terminal, a drain being used as an output terminal, and to the output terminal thereof a constant current source is connected, and wherein the amplifier is constituted of two pieces of field effect transistors of the same conductive type as the field effect transistor, having a source of an input side being connected to the constant voltage terminal, a gate being used as an input terminal, a drain being connected to the source of the field effect transistor of an output side to be an output terminal, and the gate and the drain being connected to different constant voltage terminals, respectively.

6. The oscillator as set forth in claim 5, further comprising a component which is capable of controlling an oscillation frequency by varying the values of a bias current which is supplied to the field effect transistors constituting each of the transconductors, and a bias current which is supplied to each of the field effect transistors which constitute the amplifier, while maintaining a ratio therebetween at a constant value.

7. An oscillator, comprising:

a feedback loop formed by connecting in series constituent elements including first and second transconductors, each of which has a pair of differential inputs and a pair of differential outputs, each of which has a high negative gain for a common voltage, and each of which has a certain transconductance for a differential voltage; and a first amplifier which has a pair of differential inputs and a pair of differential outputs, for the differential voltage, the first amplifier has a certain gain, and for the common voltage, the first amplifier has a negative gain of the same magnitude as the gain, wherein a first capacitor is attached to the outputs of the first transconductor and a second capacitor is attached to the outputs of the second transconductor to form a band-pass filter, and wherein an output of the band-pass filter is fed-back to an input of band-pass filter, and the output of the band-pass filter can be drawn out from arbitrary positions on the feedback loop.

8. The oscillator as set forth in claim 7, wherein the feedback loop is constituted by connecting an output of the first transconductor to an input of the second transconductor, an output of the second transconductor to an input of the first amplifier, and an output of the amplifier to an input of the first transconductor, and wherein one of terminal pairs of the first capacitor is used as an input to the band-pass filter, the other one of the terminal pairs being connected to the output of the first transconductor, the second capacitor being connected between the outputs of the second transconductor, and the outputs of the first amplifier are used as an output of the band-pass filter.

9. The oscillator as set forth in claim 7, wherein the feedback loop is constituted by connecting an output of the first transconductor to an input of the first amplifier, an output of the first amplifier to an input of the second transconductor, and an output of the second transconductor to an input of the first transconductor, and wherein one of terminal pairs of the first capacitor is used as an input to the band-pass filter, the other one of the terminal pairs being connected to the outputs of the first transconductor, the second capacitor being connected between the outputs of the second transconductor, an output of the second transconductor being connected to an input of a second amplifier having a pair of differential inputs and a pair of differential outputs, and the outputs of the second amplifier are used as the output of the band-pass filter.

10. The oscillator as set forth in claim 8,
wherein a third transconductor, in which terminals of opposite polarities are connected to each other between the inputs, and the outputs are connected to the outputs of the second transconductor.

11. The oscillator as set forth in claim 9,
wherein a third transconductor, in which terminals of opposite polarities are connected to each other between the inputs, and the outputs are connected to the outputs of the second transconductor.

12. The oscillator as set forth in claim 8, further comprising
a fourth transconductor having a pair of differential inputs and a pair of differential outputs of which an input is common with the first transconductor and of which an output is connected to the input of the band-pass filter,
wherein connection between the inputs and the outputs is such that either one of the inputs or the outputs of the fourth transconductor has opposite polarity with respect to the first transconductor, and
wherein a ratio of transconductance of the fourth transconductor to transconductance of the first transconductor is equal to an absolute gain of the first amplifier.

13. The oscillator as set forth in claim 9, further comprising
a fourth transconductor having a pair of differential inputs and a pair of differential outputs of which an input is common with the first transconductor and of which an output is connected to the input of the band-pass filter,
wherein connection between the inputs and the outputs thereof is such that either one of the inputs or the outputs of the fourth transconductor has opposite polarity with respect to the first transconductor, and
wherein a ratio of transconductance of the fourth transconductor to transconductance of the first transconductor is equal to the absolute gain of the first amplifier.

14. The oscillator as set forth in claim 7,
wherein each of the transconductors is constituted of a pair of field effect transistors, each of the pair of field effect transistors having a source being connected to a common constant voltage terminal, a gate being used as an input terminal pair, a drain being used as an output terminal pair, a constant current source being connected to the pair of differential outputs, respectively; and the amplifier is constituted of two pairs of field effect transistors having the same conductive type as the pair of field effect transistors, sources of the field effect transistor pair at the input side being connected to the constant voltage terminals, gates being used as input terminal pairs, drains being connected respectively to the source pairs of the output side field effect transistors to be used as output terminal pairs, gates and drains thereof being connected respectively to different terminals of constant voltages.

15. The oscillator as set forth in claim 14, further comprising:
means enabling control of an oscillation frequency, by varying the values of a bias current to the pair of field effect transistors of the transconductor and a bias current to the pair of field effect transistors of the amplifier while maintaining the ratio of bias currents at a constant.

16. The oscillator as set forth in claim 1, further comprising
a limiter circuit for limiting an amplitude is inserted between the output of the band-pass filter and the input of the band-pass filter.

17. The oscillator as set forth in claim 2, further comprising:
a limiter circuit for limiting an amplitude is inserted between the output of the band-pass filter and the input of the band-pass filter.

18. The oscillator as set forth in claim 7, further comprising:
a limiter circuit for limiting an amplitude is inserted between the output of the band-pass filter and the input of the band-pass filter.

19. The oscillator as set forth in claim 8, further comprising:
a limiter circuit for limiting an amplitude is inserted between the output of the band-pass filter and the input of the band-pass filter.

* * * * *